(12) United States Patent
Shin et al.

(10) Patent No.: US 11,050,143 B2
(45) Date of Patent: Jun. 29, 2021

(54) INTEGRATED VEHICLE ANTENNA

(71) Applicant: SAMSUNG ELECTRONICS CO., LTD., Suwon-si (KR)

(72) Inventors: Yongsun Shin, Suwon-si (KR); Jinu Kim, Suwon-si (KR); Sangbong Sung, Suwon-si (KR); Jeseung Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 16/430,570

(22) Filed: Jun. 4, 2019

(65) Prior Publication Data

US 2020/0185820 A1 Jun. 11, 2020

(30) Foreign Application Priority Data

Dec. 6, 2018 (KR) .................. 10-2018-0156108

(51) Int. Cl.
| | |
|---|---|
| *H01Q 1/32* | (2006.01) |
| *B62D 25/06* | (2006.01) |
| *H01Q 9/40* | (2006.01) |
| *H03H 7/38* | (2006.01) |
| *H01Q 5/335* | (2015.01) |
| *H01Q 1/36* | (2006.01) |

(52) U.S. Cl.
CPC .......... *H01Q 1/3275* (2013.01); *B62D 25/06* (2013.01); *H01Q 1/3291* (2013.01); *H01Q 1/36* (2013.01); *H01Q 5/335* (2015.01); *H01Q 9/40* (2013.01); *H03H 7/38* (2013.01)

(58) Field of Classification Search
None
See application file for complete search history.

(56) References Cited

U.S. PATENT DOCUMENTS

| | | | | |
|---|---|---|---|---|
| 3,247,509 A | * | 4/1966 | Hamann | G01S 13/751 342/44 |
| 3,403,403 A | * | 9/1968 | Howell | H01Q 15/00 343/708 |
| 4,132,995 A | * | 1/1979 | Monser | H01Q 13/18 343/767 |
| 9,786,992 B2 | | 10/2017 | Denis | |
| 2009/0231215 A1 | * | 9/2009 | Taura | H01Q 1/243 343/702 |
| 2013/0063310 A1 | * | 3/2013 | Mak | H01Q 21/08 343/700 MS |
| 2017/0054204 A1 | | 2/2017 | Changalvala et al. | |
| 2017/0187101 A1 | * | 6/2017 | Freeman | H01Q 1/3291 |
| 2017/0293832 A1 | * | 10/2017 | Pai | G06K 19/07758 |

(Continued)

FOREIGN PATENT DOCUMENTS

| | | |
|---|---|---|
| EP | 3270460 A1 | 1/2018 |
| JP | 2003-249812 A | 9/2003 |
| JP | 2004-134922 A | 4/2004 |

(Continued)

*Primary Examiner* — Crystal L Hammond
(74) *Attorney, Agent, or Firm* — Sughrue Mion, PLLC (57) ABSTRACT

An integrated vehicle antenna is provided. The integrated vehicle antenna includes a first slot, a feeding part connected to a second slot formed in a location corresponding to the first slot, and a reflector that is disposed in the lower part of the second slot to cover the second slot and the feeding part, and reflects radio waves generated at the first slot.

15 Claims, 13 Drawing Sheets

(56) References Cited

U.S. PATENT DOCUMENTS

2017/0317408 A1   11/2017  Hamada et al.
2018/0122236 A1    5/2018  Murray et al.

FOREIGN PATENT DOCUMENTS

| | | |
|---|---|---|
| JP | 2007-158906 A | 6/2007 |
| JP | 2009-246795 A | 10/2009 |
| JP | 2017-200086 A | 11/2017 |
| KR | 20-1991-0000275 Y1 | 1/1991 |
| KR | 10-1379451 B1 | 3/2014 |
| KR | 10-1432789 B1 | 8/2014 |
| KR | 10-2016-0023744 A | 3/2016 |
| KR | 10-1677984 B1 | 11/2016 |
| KR | 10-2017-0004431 A | 1/2017 |
| KR | 10-1842082 B1 | 3/2018 |

\* cited by examiner

INTEGRATED VEHICLE ANTENNA

CROSS-REFERENCE TO RELATED APPLICATION(S)

This application is based on and claims priority under 35 U.S.C. § 119(a) from Korean Patent Application No. 10-2018-0156108, filed on Dec. 6, 2018, in the Korean Intellectual Property Office, the disclosure of which is incorporated by reference herein in its entirety.

BACKGROUND

1. Field

The disclosure relates to an integrated vehicle antenna having an improved radiation region and radiation pattern, and which can be applied to a vehicle without issue as to size.

2. Description of Related Art

A vehicle antenna is a device that transmits and receives information that may be utilized by a user of a vehicle. Recently, the amount of information provided to a user has increased as various types of information media have been developed. Accordingly, the amount of information that a vehicle antenna transmits and receives has correspondingly increased.

A vehicle antenna has become capable of performing wireless communication, performing GPS communication for transmitting and receiving location information of a vehicle, and performing vehicle to everything (V2X) communication for communication with the outside of a vehicle, etc., through a plurality of antennas disposed inside a shark fin antenna located on the rear surface of a roof of a vehicle.

In particular, recently, transmission and receipt of information using a frequency domain of L2 (1215-1239 MHz) or L5 (1168-1188 MHz) as well as a conventional frequency domain (1574.4 MHz or 1601 MHz) for GPS communication is required.

In this regard, as frequencies of L2 and L5 are lower than conventional frequencies, an antenna having a larger size is required. However, there is a problem that in a conventional shark fin antenna, an antenna having a size for transmission and reception of frequencies of L2 and L5 is difficult to be accommodated, and also, a size of an antenna for transmission and reception of frequencies of L2 and L5 is difficult to be implemented, even in the form of a patch antenna.

In addition, there is a problem that a shark fin antenna is in a form generally protruding on a roof of a vehicle, and thus a radiation pattern toward the front side of the vehicle is difficult to be implemented. Further, a shark fin antenna damages the aesthetic exterior of a vehicle, and is easy to be damaged by its external environment. Also, there is a problem that, in case a vehicle runs at a high speed, wind noise is generated from a shark fin antenna.

SUMMARY

The disclosure is aimed at providing an integrated vehicle antenna having an radiation region and radiation pattern, and which can be applied to a vehicle without an issue as to the size thereof.

An integrated vehicle antenna according to an embodiment of the disclosure for achieving the aforementioned purpose may include a first slot, a feeding part connected to a second slot formed in a location corresponding to the first slot, and a reflector disposed in the lower part of the second slot to cover the second slot and the feeding part, the reflector configured to reflect radio waves generated at the first slot.

The second slot may be disposed in a location opposing the first slot to be connected to the outside through the first slot.

The reflector may include a reflective surface formed to enclose the feeding part, and the reflective surface may form a reflective space connected to the first and second slots to generate directivity in a predetermined direction.

The feeding part may include a dielectric layer and a feeding terminal may be disposed on one side of the feeding part.

Meanwhile, the feeding terminal may be disposed to cross the second slot.

Also, the feeding terminal may be disposed in a location of impedance matching in a longitudinal direction of the second slot.

The shape of the second slot may be identical to the shape of the first slot.

The shape of the first slot may be a rectangle.

Also, the first slot may include at least one bending part.

The first slot may be formed on a vehicle body, and the feeding part may be disposed on the bottom surface of the vehicle body.

In addition, the first slot may be formed on the roof of the vehicle body.

Further, the first slot may be formed in the edge part of the front surface of the roof of the vehicle body.

The first slot may comprise a plurality of first slots, and each first slot of the plurality of the first slots may be disposed at predetermined intervals.

Also, the second slot may comprise a plurality of second slots, and each second slot of the plurality of second slots may be disposed in a location corresponding to the plurality of the first slots.

In addition, the second slot may comprise a plurality of second slots, and the first slots may be formed to include all of the plurality of the second slots.

Meanwhile, the integrated vehicle antenna according to an embodiment of the disclosure may further include a cover member disposed on the top surface of the vehicle body to cover the first slot.

The first slot may have the same length as the half wavelength of the resonance frequency of the integrated vehicle antenna.

DETAILED DESCRIPTION

Hereinafter, preferred embodiments of the disclosure will be described with reference to the accompanying drawings, for comprehensive understanding of the constitution and the effect of the disclosure. Meanwhile, it should be noted that the disclosure is not limited to the embodiments described herein, but may be implemented in various forms, and various modifications may be made to the embodiments of the disclosure. The descriptions of the embodiments of the disclosure are provided to make the descriptions of the disclosure complete, and fully convey the range of the disclosure to people having ordinary knowledge in the art to which the disclosure belongs. Meanwhile, in the accompanying drawings, components were illustrated in more enlarged sizes than their actual sizes for the convenience of description, and the proportion of each component may be exaggerated or reduced.

In case it is described that a component is "on top of" or "contacts" another component, it should be understood that a component may directly contact or be connected with the top portion of another component, but still another component may exist between the components. In contrast, in case it is described that a component is "just on top of" or "directly contacts" another component, it may be understood that still another component does not exist between the components. Other expressions describing relations between components, for instance, expressions such as "between ~" and "directly between ~" may be interpreted in the same manner.

The terms "first," "second" and the like used in the disclosure may be used to describe various components, but the components should not be limited by the terms. Such terms may be used only to distinguish one component from another component. For example, a first component may be referred to as a second component, and a second component may be referred to as a first component in a similar manner, without departing from the scope of the disclosure.

Singular expressions may include plural expressions, unless defined obviously differently in the context. Meanwhile, terms such as "include" or "have" should be construed as denoting that there are such characteristics, numbers, steps, operations, components, parts or a combination thereof described in the specification, and that one or more other characteristics or numbers, steps, operations, components, parts or a combination thereof may be added.

The terms used in the embodiments of the disclosure may be interpreted as meanings that are generally known to people having ordinary knowledge in the art described in the disclosure, unless otherwise defined.

Hereinafter, a configuration of an integrated vehicle antenna 2 will be described with reference to FIGS. 1 to 3. Here, the integrated vehicle antenna 2 may also be referred to as an integrated vehicle multi band antenna for L2 and L5.

Figure 1:
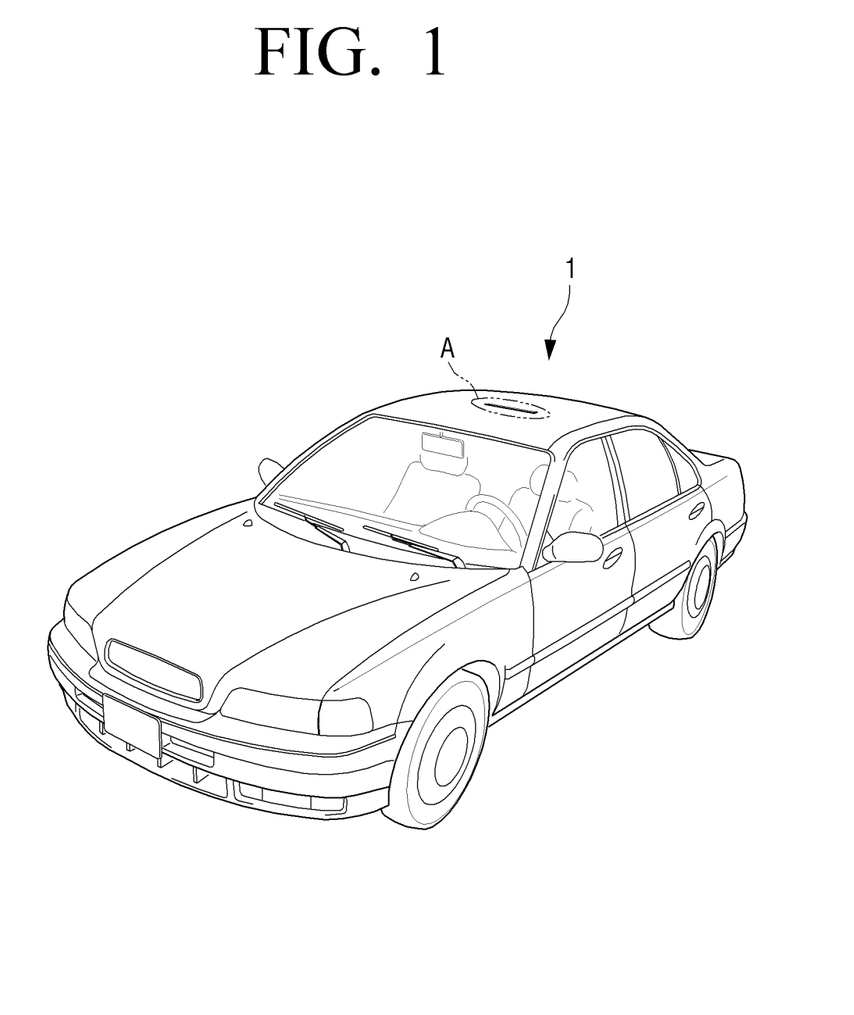
FIG. 1 is a perspective view illustrating a vehicle according to an embodiment of the disclosure.
Figure 2:
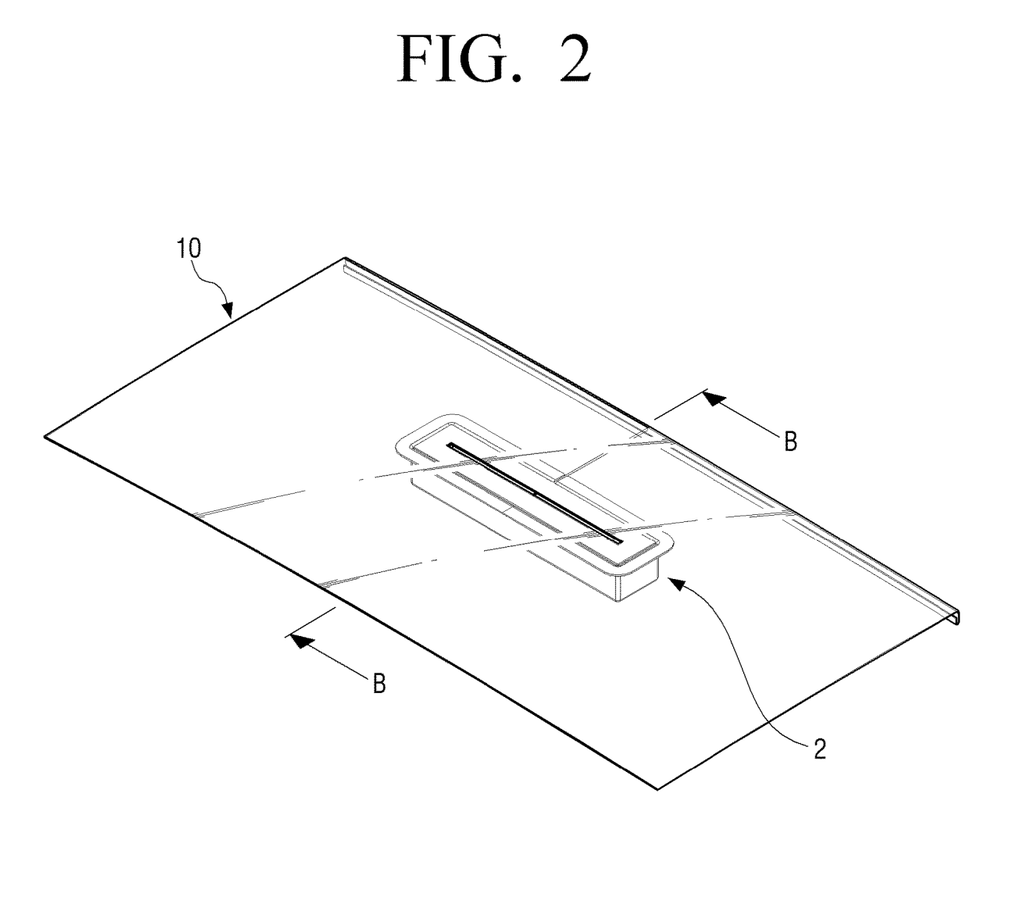
FIG. 2 is a perspective view illustrating an enlarged view of portion A of FIG. 1.

FIG. 1 is a perspective view illustrating a vehicle 1 according to an embodiment of the disclosure. FIG. 2 is a perspective view illustrating an enlarged view of portion A of FIG. 1. FIG. 3 is an exploded perspective view of an integrated vehicle antenna according to an embodiment of the disclosure.

The vehicle 1 may include a vehicle body 10 forming the exterior of the vehicle 1, and an integrated vehicle antenna 2 that is disposed inside the vehicle body 10.

The vehicle body 10 may be implemented as a metal, plastic, or composite material having a strength above a certain level, and form the overall exterior of the vehicle 1 including the top, bottom, left side, and right side sections thereof.

The integrated vehicle antenna 2 may be a slot antenna, and operate as a radiator of radio waves as it feeds power to a slot.

Also, the integrated vehicle antenna 2 may receive information that a user using the vehicle 1 needs such as traffic information, radio broadcasting, or vehicle location information, and in general any information that is needed for autonomous driving of the vehicle 1, and the like received from an external device or source, or may transmit such information to an external device.

According to an embodiment of the disclosure, a GNSS may be, for example, a Global Positioning System (GPS), a Global Navigation Satellite System (Glonass), a Beidou Navigation Satellite System (hereinafter referred to as "Beidou"), or a Galileo, the European global satellite-based navigation system. Hereinafter, a "GPS" may be interchangeably used with a "GNSS" in the disclosure.

Meanwhile, an external device may be a communication device that is capable of transmitting and receiving signals, such as a broadcasting device, a radio broadcasting device, a satellite signal transmitting and receiving device (e.g., a GPS), or a user terminal, and the like.

Further, an external device may be a communication device that supports vehicle to everything (V2X) communication. Other than the aforementioned devices, an external device may include various types of devices that are capable of transmitting and receiving signals through wireless communication or wired communication.

The integrated vehicle antenna 2 may include a first slot 11 formed on the vehicle body 10, a feeding part 20 in which a second slot 21 is formed, and which is disposed in a location corresponding to the first slot 11 on the bottom surface 10b (refer to FIG. 6) of the vehicle body 10, and a reflector 30 that is disposed on the bottom surface 10b of the vehicle body 10 to cover the second slot 21 and the feeding part 20.

The first slot 11 may be formed in various locations, such as the roof which is the top surface of the vehicle body 10, the front surface, the rear surface, and both side surfaces. That is, the integrated vehicle antenna 2 may be disposed in various locations at which radiation patterns are formed in directions needed in L2 and L5 bands, such as the roof which is the top surface of the vehicle body 10, the front surface, the rear surface and both side surfaces, and the trunk, the dashboard, etc. where the first slot 11 is formed, according to the bands used.

However, as illustrated in FIGS. 1 to 11, an integrated vehicle antenna according to an embodiment of the disclosure will be described based on an example that the antenna is formed on the roof of a vehicle.

The length L of the first slot 11 may be formed to be bigger than the width W, and the length L may be the same length as the half wavelength of the resonance frequency of the integrated vehicle antenna 2.

In case the antenna is implemented as a multi band antenna that simultaneously supports L2 and L5, a slot length which is longer than the half wavelength will be needed. However, as a FR4 board is applied to the feeding part, the slot length will be shortened as much as $1/\sqrt{2}$. Accordingly, size of the antenna may be reduced and easily mountable on the vehicle.

In addition, according to the length L of the first slot 11, a specific resonance frequency may be implemented. For example, according to the length L of the first slot 11, an antenna that supports GPS and SDARS (2.32 GHz-2.345 GHz) bands may be implemented.

Also, the form of the first slot 11 may be a rectangle. Accordingly, a simple form of the first slot 11 can be implemented on the vehicle body 10, and thus the manufacturing process of the integrated vehicle antenna 2 can be simplified, and the manufacturing cost thereof can also be reduced.

Meanwhile, the form of the first slot 11 may be modified into various forms according to the polarized waves.

On the feeding part 20, a second slot 21 corresponding to the first slot 11 is formed, and the feeding part 20 is disposed on the bottom surface 10b of the vehicle body 10. The feeding part 20 may be fixed to the bottom surface 10b of the vehicle body 10 by using various tools.

For example, the feeding part 20 may be adhered to the bottom surface 10b of the vehicle body 10 by using double-sided tape, etc., or connected to the bottom surface 10b of the vehicle body 10 through a separate member such as a screw.

The second slot 21 is disposed in a location opposing the first slot 11, and thus the second slot 21 and the first slot 11 may be spatially connected. Further, a size of the second slot 21 may be equal to a size of the first slot 11.

Accordingly, a signal that is radiated from the first slot 11 may be propagated into a reflective space S of a reflector 30 without being absorbed or blocked by the second slot 21.

Meanwhile, the feeding part 20 may be constructed as a FR4 board that can be attached to a vehicle, and include a dielectric layer 22 having a relative permittivity value (4~4.6).

Also, a reflector 30 is applied to the integrated vehicle antenna 2 to block radiation into the vehicle, and to improve directivity of the radio waves in an upward direction of the roof. When a reflector 30 is applied, the slot length may be longer than the half wavelength for impedance matching.

For example, for implementing an antenna that supports multi bands of L2 (1215~1239 MHz) and L5 (1168~1188 MHz), the length of the first slot 11 to which a reflector 30 is not coupled is 125 mm, and the length of the first slot 11 to which a reflector 30 is coupled is 200 mm. However, in case a feeding part 20 including a dielectric layer 22 is disposed, the first slot 11 may implement the same resonance frequency even with a length of 140 mm.

That is, in a structure including a reflector 30 for improving the radiation pattern and the directivity of radio waves, miniaturization of an integrated vehicle antenna 2 for L2 and L5 may be implemented by shortening the length of the first slot 11.

Hereinafter, a detailed configuration of a feeding part 20 will be described with reference to FIGS. 3 and 4.

Figure 4:
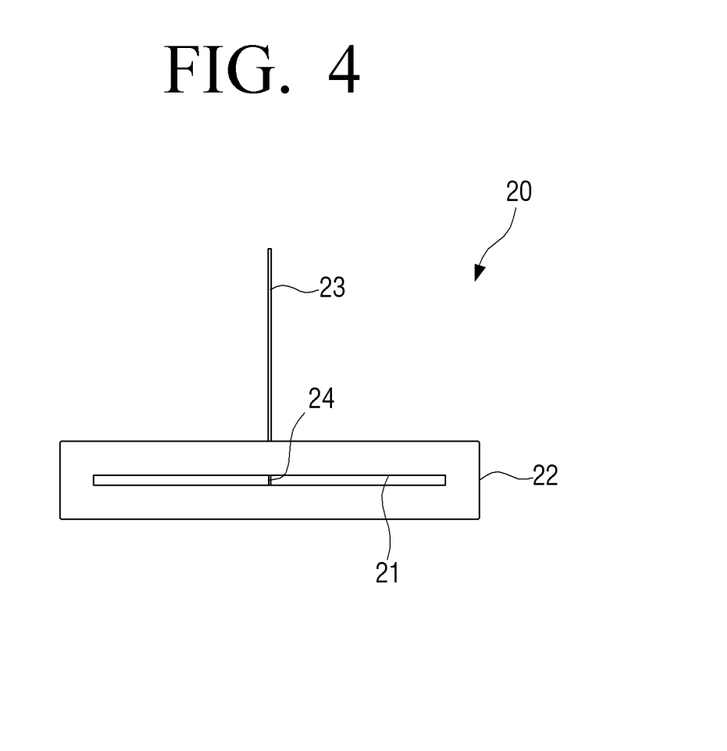
FIG. 4 is a top view of a feeding part according to an embodiment of the disclosure.

FIG. 4 is a top view of a feeding part 20 according to an embodiment of the disclosure.

The feeding part 20 is a plate in the form of a rectangle at which a second slot 21 has been formed, and a feeding terminal 24 may be disposed on one side of the feeding part 20.

The feeding terminal 24 is connected with the feeding part through a cable 23, and the feeding terminal 24 may be provided with power according to a signal pattern to be radiated, and may flow a provided signal around the first slot 11 in the form of a current.

Accordingly, a current moves around the first slot 11, and a signal having a specific resonance frequency by an electric field and a magnetic field generated by the current may be generated.

The feeding terminal 24 may be disposed to cross the second slot 21, and may also be disposed in a location that constitutes impedance matching in a longitudinal direction of the second slot 21.

Figure 3:
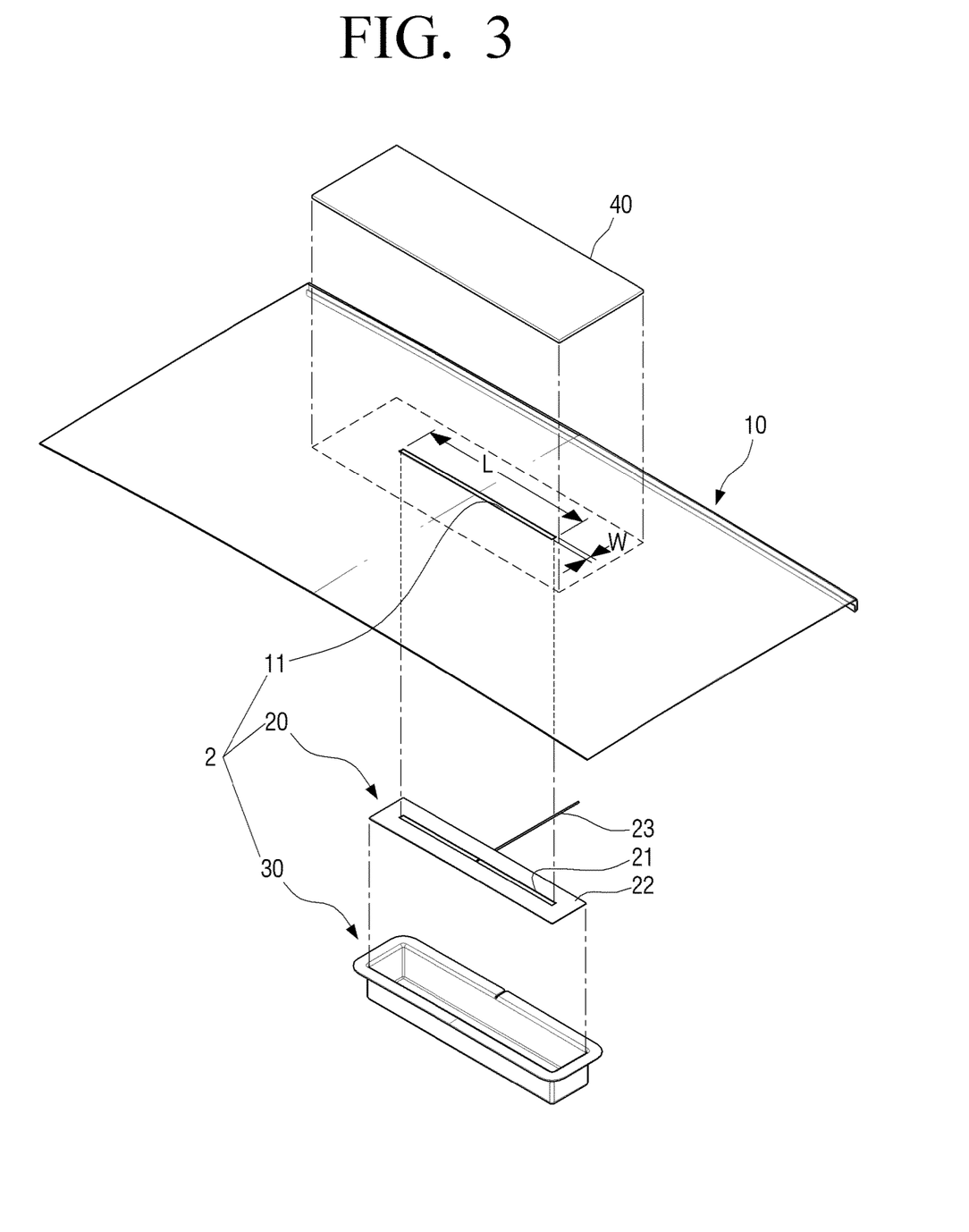
FIG. 3 is an exploded perspective view of an integrated vehicle antenna according to an embodiment of the disclosure.

Further, as illustrated in FIG. 3, the integrated vehicle antenna 2 may further include a cover member 40 disposed on the top surface 10a of the vehicle body 10 to cover the first slot 11.

Accordingly, the cover member 40 may prevent foreign substances, such as dirt, water, and the like, from entering inside the first slot 11, and may also prevent contamination or damage of the integrated vehicle antenna 2 due to an external substance.

For example, the cover member 40 may prevent water from entering inside the first slot 11 due to snow or rain from the external environment, or washing of the vehicle 1.

Meanwhile, the cover member 40 may be constructed with a material through which a signal generated from the first slot 11 can pass. Also, the cover member 40 may have various sizes and forms, so long as the first slot 11 is sufficiently protected.

Hereinafter, a detailed configuration of a reflector 30 will be described with reference to FIGS. 5 and 6.

Figure 5:
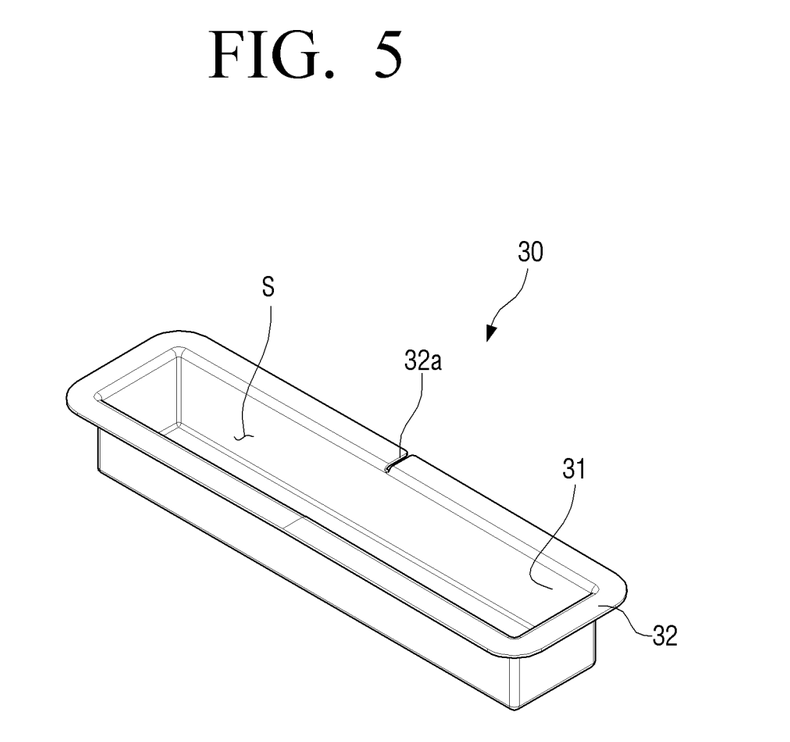
FIG. 5 is a perspective view of a reflector according to an embodiment of the disclosure.
Figure 6:
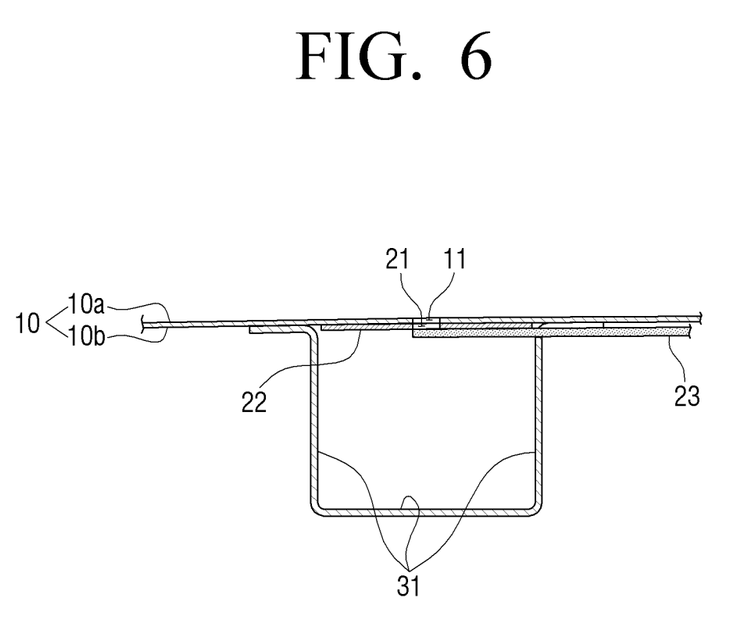
FIG. 6 is a cross-sectional view illustrated along line B of FIG. 2.
Figure 7:
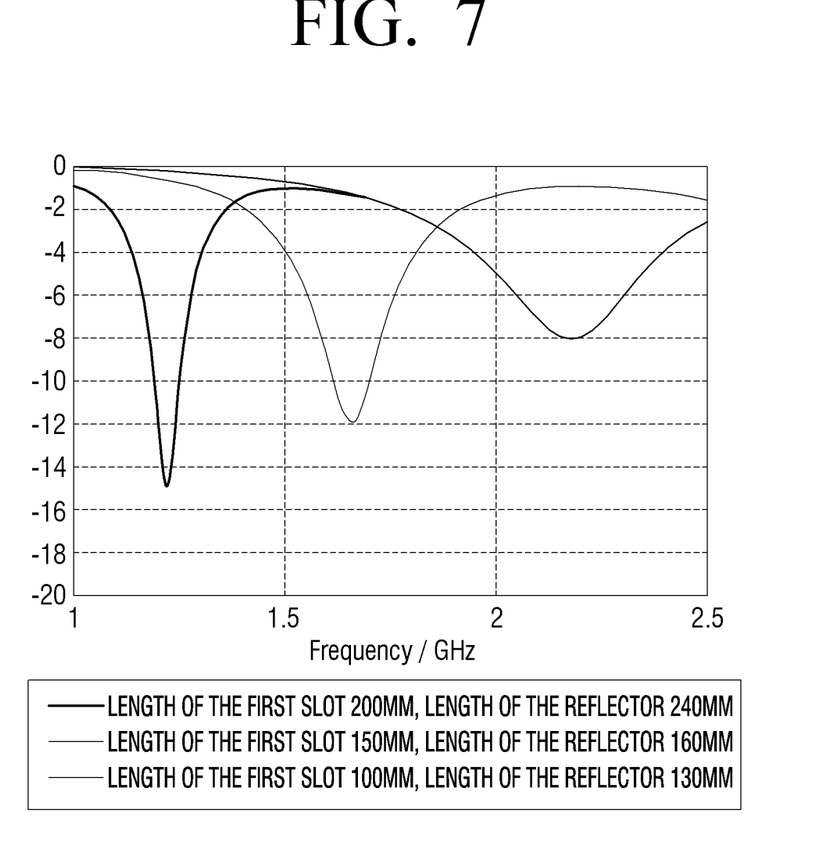
FIG. 7 is a graph illustrating a frequency domain according to the length of a first slot.

FIG. 5 is a perspective view of a reflector 30 according to an embodiment of the disclosure, and FIG. 6 is a cross-sectional view illustrated along line B of FIG. 2.

The reflector 30 may be disposed on the bottom surface 10b of the vehicle body 10 to cover the first slot 11 and the feeding part 20. To be specific, the reflector 30 may include a reflective surface 31 formed to enclose the feeding part 20.

The reflective surface 31 may form the exterior and the internal surface of the reflector 30, and may form a reflective space S that is connected with the first and second slots 11, 21 spatially, and the reflective space S does not have its own resonance frequency.

Accordingly, a signal radiated from the first slot 11 may pass through the second slot 21 and be radiated into the reflective space S, and the signal radiated into the reflective space S may be reflected by the reflective surface 31 that surrounds the reflective space S.

Meanwhile, the reflector 30 may be in the form of a cuboid having a reflective space S, and the reflective surface 31 may form the bottom surface and the side surfaces excluding the top surface of the reflector 30.

In addition, the reflective surface 31 is constructed with a metal material, and its internal surface may be formed to be flat, to uniformly reflect a signal radiated from the first slot 11.

Further, the reflector 30 may prevent radiation of a signal having a specific resonance frequency generated from the first slot 11 into the vehicle 1, and may also reflect a signal radiated into the vehicle 1 to the top portion and the side surfaces of the vehicle 1.

Meanwhile, on the edge of the top portion of the reflector 30, a connecting part 32 for contacting the bottom surface 10b of the vehicle body 10 may be formed. Accordingly, the reflector 30 may be adhered or fixed to the bottom surface 10b of the vehicle body 10 through the connecting part 32, and may thereby be stably disposed.

In addition, in a portion of the connecting part 32, an accommodating part 32a for accommodating a cable 23 of the feeding part 20 may be formed. The accommodating part 32a may accommodate the cable 23, and may thereby securely fix the location of the cable 23.

Hereinafter, an operation of the reflector 30 will be described in detail with reference to FIG. 8.

Figure 8:
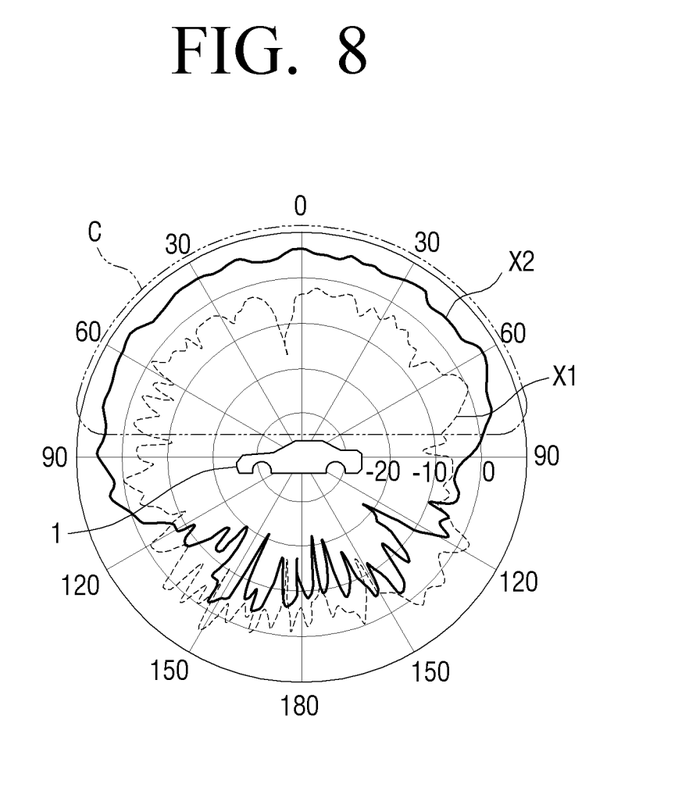
FIG. 8 is a graph comparing radiation patterns according to whether a reflector exists.

FIG. 8 is a graph comparing radiation patterns according to whether a reflector 30 exists.

As illustrated in FIG. 8, a signal radiated by the integrated vehicle antenna 2 may be radiated around the vehicle 1.

Here, a first radiation pattern X1 in case the integrated vehicle antenna 2 does not include a reflector 30 is radiated while being distributed uniformly around the vehicle 1. That is, a signal radiated from the first slot 11 is uniformly distributed to the outside and the inside of the vehicle 1.

In contrast, a second radiation pattern X2 in case the integrated vehicle antenna 2 includes a reflector 30 has more improved directivity than the first radiation pattern X1 in the top portion of the vehicle 1 and a first region C including the top portion.

That is, a signal radiated from the first slot 11 is reflected by the reflector 30 disposed in the lower portion of the first slot 11, and is radiated to the top portion of the vehicle 1 and the first region C including the top portion.

In particular, in the case of GPS communication performing communication with the satellite of the vehicle 1, the sensitivity of the signal of GPS communication increases as the directivity and the sensitivity of the first region C of the vehicle 1 increase.

In addition, by using the integrated vehicle antenna 2, directivity of various types of communication such as V2X as well as GPS communication can be improved.

Hereinafter, a modified embodiment of the first slot 12 will be described with reference to FIG. 9.

Figure 9:
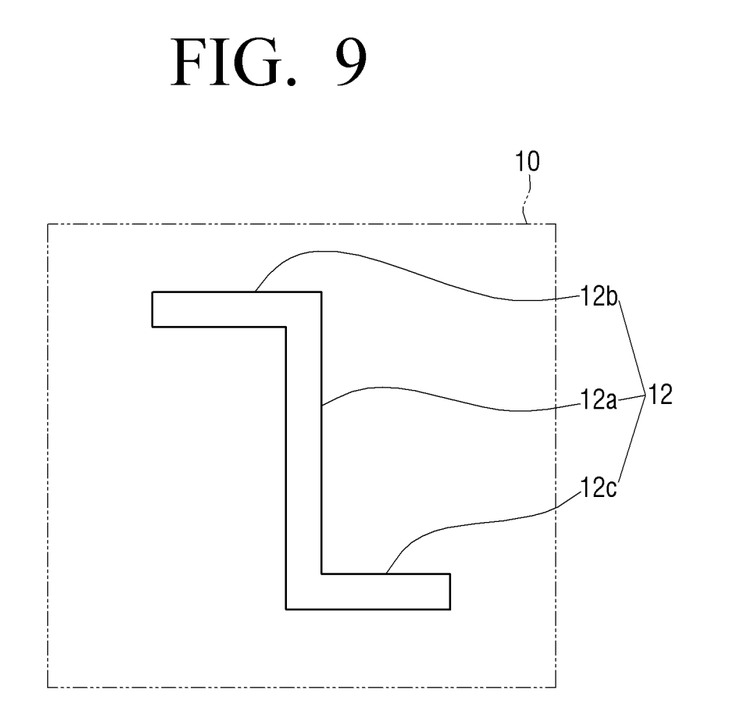
FIG. 9 is a bottom view illustrating a first slot according to an embodiment of the disclosure.

FIG. 9 is a bottom view illustrating a first slot 12 according to an embodiment of the disclosure.

As the configuration of the vehicle body 10 illustrated in FIG. 9 is identical to the aforementioned configuration, overlapping descriptions will be omitted.

The first slot 12 may include at least one bending part. To be specific, the first slot 12 may include a first portion 12a in the form of a rectangle, and second and third portions 12b, 12c that are formed at distal ends of the first portion 12a and extending in opposing directions on both ends of the first portion 12a.

Accordingly, the first slot 12 may implement a signal having circular polarized waves. Because of the circular polarized waves, the first slot 12 is strong against noise from obstacles and multiple reflection interferometry, and thus loss of polarized waves may be small.

Meanwhile, circular polarized waves may also be implemented by using the phase contrast of a signal.

Hereinafter, another modified embodiment of the first slot 13 will be described with reference to FIG. 10.

Figure 10:
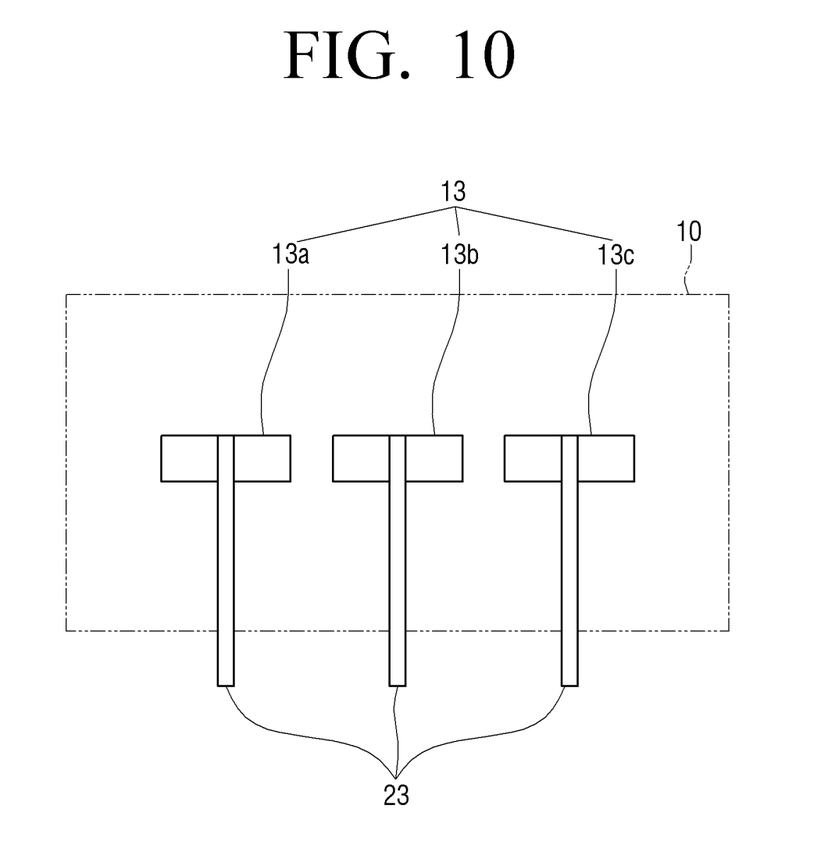
FIG. 10 is a bottom view illustrating a first slot according to an embodiment of the disclosure.

FIG. 10 is a bottom view illustrating a first slot 13 according to an embodiment of the disclosure.

As the configurations of the vehicle body 10 and the cable 23 illustrated in FIG. 10 are identical to the aforementioned configurations, overlapping descriptions will be omitted.

The first slot may comprises a plurality of first slots 13a, 13b, 13c and the plurality of the first slots 13a, 13b, 13c may be disposed at predetermined intervals. Also, each of the plurality of the first slots 13a, 13b, 13c may be provided with power through the cable 23.

Accordingly, each of the plurality of the first slots 13a, 13b, 13c may implement a signal having a specific resonance frequency, and at the same time, directivity in a specific direction and radiation patterns can be improved by interference among signals.

That is, the plurality of the first slots 13a, 13b, 13c disposed at predetermined intervals may implement an antenna array.

Accordingly, the plurality of the first slots 13a, 13b, 13c may be implemented as an antenna array in an integrated form of RFA and RFB, which can implement 5G communication. Here, RFA may mean an assembly of several antennas including the plurality of the first slots 13a, 13b, 13c, and RFB may mean a board that is connected to the RFA and operates the several antennas.

Further, as the plurality of the first slots 13a, 13b, 13c are formed to be integrated with the vehicle body 10, the manufacturing process can be simplified, and directivity in a specific direction and radiation patterns can be improved.

Also, the form of each of the plurality of the first slots 13a, 13b, 13c may be identical to one another, and the length and width of each slot may vary depending on communication requirements of the antenna.

Meanwhile, the plurality of the first slots 11 may be at least two slots disposed at a predetermined interval.

Hereinafter, another modified embodiment of the second slot 21' will be described with reference to FIG. 11.

Figure 11:
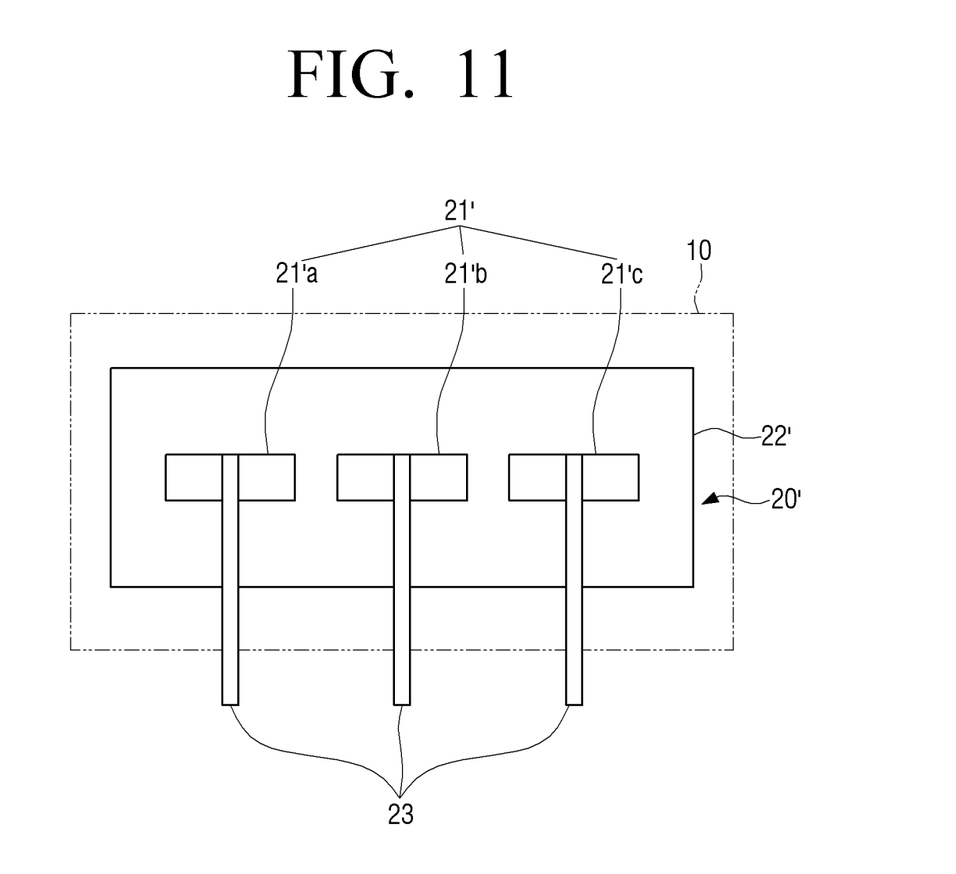
FIG. 11 is a bottom view illustrating a second slot according to an embodiment of the disclosure.

FIG. 11 is a bottom view illustrating a second slot 21' according to an embodiment of the disclosure.

As the configurations of the vehicle body 10 and the cable 23 illustrated in FIG. 11 are identical to the aforementioned configurations, redundant descriptions will be omitted.

Referring to FIG. 11, a feeding part 20' including a dielectric layer 22 disposed on the bottom surface 10b of the vehicle body 10 may include a plurality of the second slots 21' a, 21' b, 21' c.

Meanwhile, each of the plurality of the second slots 21' a, 21' b, 21' c may be disposed in a location corresponding to the plurality of the first slots 13a, 13b, 13c, or implemented in one first slot including the plurality of the second slots 21' a, 21' b, 21' c.

Also, each of the plurality of the second slots 21' a, 21' b, 21' c may be provided with power through the cable 23.

Hereinafter, a vehicle 1' according to another embodiment of the disclosure will be described with reference to FIGS. 12 and 13.

Figure 12:
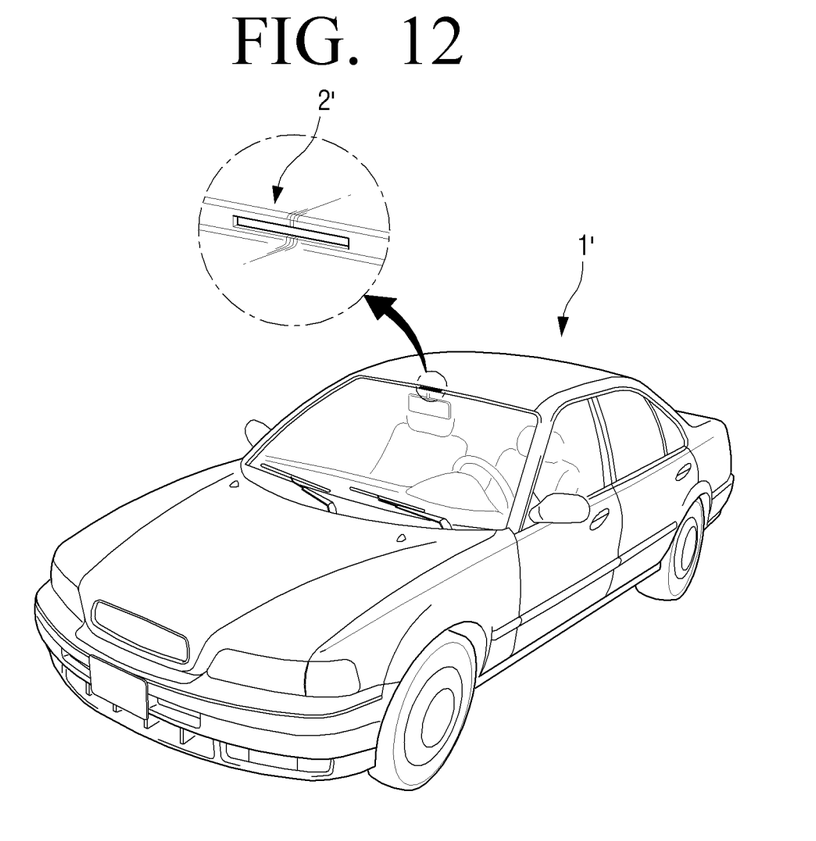
FIG. 12 is a perspective view illustrating a vehicle according to an embodiment of the disclosure.
Figure 13:
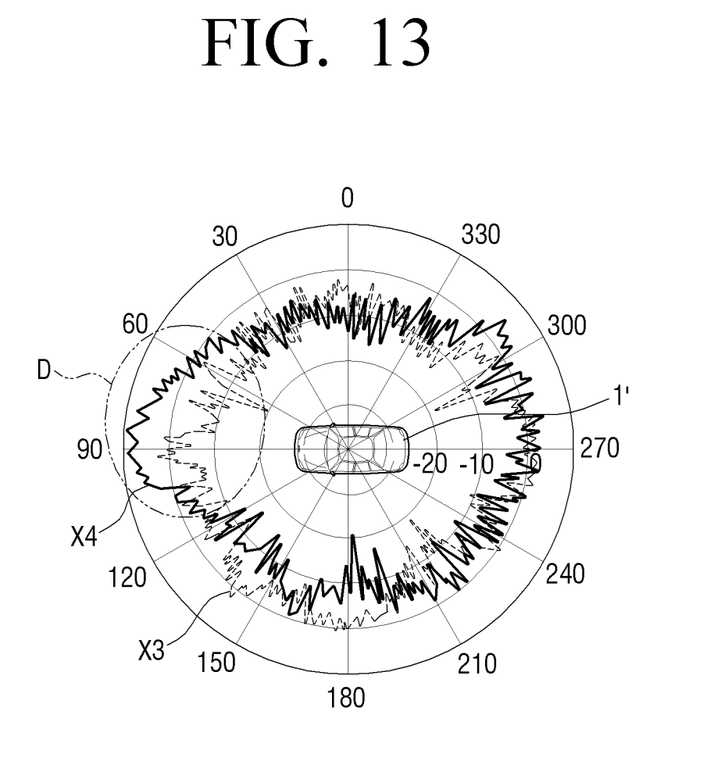
FIG. 13 is a graph illustrating a radiation pattern of a vehicle according to an embodiment of the disclosure.

FIG. 12 is a perspective view illustrating a vehicle 1' according to an embodiment of the disclosure, and FIG. 13 is a graph illustrating a radiation pattern of a vehicle 1' according to an embodiment of the disclosure.

An integrated vehicle antenna 2' illustrated in FIG. 12 may include the same feeding part 20 and reflector 30 as those of the aforementioned integrated vehicle antenna 2 for L2 and L5. Here, whether to apply a reflector 30 may be determined according to the directivity of the radiation pattern.

Meanwhile, the integrated vehicle antenna 2' may also be referred to as an integrated vehicle V2X antenna 2'.

The integrated vehicle V2X antenna 2' illustrated in FIG. 12 may be disposed on the front surface of the vehicle body 10, unlike the integrated vehicle antenna 2 for L2 and L5 illustrated in FIG. 1.

That is, the first slot 11, the feeding part 20 and the reflector 30 included in the integrated vehicle antenna 2' may be disposed in the edge part of the front surface of the roof of the vehicle body 10.

To be specific, the integrated vehicle antenna 2' may be disposed in the bended metal portions on the front, rear, left and right edges of the roof of the vehicle body 10.

Accordingly, a third radiation pattern X3 in case a conventional vehicle antenna in the form of a shark fin is disposed in the rear portion of the roof of the vehicle body 10 is distributed around the side surfaces of the vehicle body 10 uniformly, is illustrated in FIG. 13.

In contrast, there may be provided a fourth radiation pattern X4 in case an integrated vehicle antenna 2' and a first slot 11 are formed in the bended metal portions on the front, rear, left and right edges of the roof of the vehicle body 10 has more improved directivity in a direction toward the front portion of the vehicle than the third radiation pattern X3 in a second region D including the front portion of the vehicle body 10.

Thus, in case V2X communication is performed through the first slot 11, the sensitivity and efficiency of communication with an external device located in the front portion of the vehicle can be improved.

Further, the first slot 11 and the integrated vehicle antenna 2' including the first slot 11 may be disposed in various locations of the vehicle such as the pillar, the side mirror, the room mirror, the fender, the front/rear panel, the trunk and the dashboard, in consideration of their locations with respect to an external device.

While the various embodiments of the disclosure have been described separately from one another, the embodiments do not have to be implemented independently, but the configuration and operation of each embodiment may be implemented in combination with at least one other embodiment.

Also, while preferred embodiments of the disclosure have been shown and described, the disclosure is not limited to the aforementioned specific embodiments, and various modifications can be made by those having ordinary skill in the art to which the disclosure belongs, without departing from the gist of the disclosure as claimed by the appended claims. Also, it is intended that such modifications are not to be interpreted independently from the technical idea or prospect of the disclosure.

What is claimed is:

1. An integrated vehicle antenna comprising:
a first slot formed in a vehicle body of a vehicle;
a feeding part connected to an interior surface of the vehicle body and comprising a second slot disposed in a location corresponding to the first slot, wherein the second slot and the first slot are spatially connected; and
a reflector interposed between the second slot and an interior cabin of the vehicle to cover the second slot and the feeding part, the reflector configured to reflect radio waves emitted from the first slot.

2. The integrated vehicle antenna of claim 1, wherein the reflector comprises a reflective surface formed to enclose the feeding part, and the reflective surface forms a reflective space connected to the first and second slots to generate directivity of the radio waves in a predetermined direction.

3. The integrated vehicle antenna of claim 2, wherein the feeding part comprises a dielectric layer and a feeding terminal disposed on one side of the feeding part.

4. The integrated vehicle antenna of claim 3, wherein the feeding terminal is disposed in a location of impedance matching in a longitudinal direction of the second slot.

5. The integrated vehicle antenna of claim 4, wherein the feeding terminal is disposed to cross the second slot.

6. The integrated vehicle antenna of claim 1, wherein the second slot is disposed in a location opposing the first slot to be connected to the outside through the first slot.

7. The integrated vehicle antenna of claim 1, wherein a shape of the second slot is identical to a shape of the first slot.

8. The integrated vehicle antenna of claim 1, wherein the first slot is formed in a shape of a rectangle.

9. The integrated vehicle antenna of claim 1, wherein the first slot comprises at least one bending part.

10. The integrated vehicle antenna of claim 1, wherein the first slot is formed on a roof of the vehicle body.

11. The integrated vehicle antenna of claim 1, wherein the first slot is formed in an edge part of a front surface of the roof of the vehicle body.

12. The integrated vehicle antenna of claim 1, wherein the first slot comprises a plurality of first slots, and each first slot of the plurality of the first slots is disposed at predetermined intervals.

13. The integrated vehicle antenna of claim 12, wherein the second slot comprises a plurality of second slots, and each second slot of the plurality of second slots is disposed in a location corresponding to the plurality of the first slots.

14. The integrated vehicle antenna of claim 13, wherein the plurality of first slots are formed to include the plurality of second slots.

15. The integrated vehicle antenna of claim 1, further comprising:
a cover member disposed on a top surface of the vehicle body to cover the first slot.

* * * * *